United States Patent [19]

Beardsley et al.

[11] Patent Number: 5,640,530
[45] Date of Patent: Jun. 17, 1997

[54] USE OF CONFIGURATION REGISTERS TO CONTROL ACCESS TO MULTIPLE CACHES AND NONVOLATILE STORES

[75] Inventors: Brent Cameron Beardsley; Ronald Robert Knowlden; Gail Andrea Spear, all of Tucson, Ariz.

[73] Assignee: International Business Machines Corporation, Armonk, N.Y.

[21] Appl. No.: 386,602

[22] Filed: Feb. 10, 1995

Related U.S. Application Data

[63] Continuation of Ser. No. 992,368, Dec. 17, 1992, abandoned.

[51] Int. Cl.⁶ .............................. G06F 11/20; G06F 12/16
[52] U.S. Cl. .................... 395/440; 395/489; 395/182.03; 395/182.12
[58] Field of Search ........................................ 395/440, 441, 395/439, 750, 182.12, 182.2, 489, 182.03, 182.05

[56] References Cited

U.S. PATENT DOCUMENTS

| | | | |
|---|---|---|---|
| 4,853,846 | 8/1989 | Johnson et al. | 395/281 |
| 4,907,228 | 3/1990 | Bruckert et al. | 395/182.09 |
| 4,916,605 | 4/1990 | Beardsley et al. | 395/489 |
| 4,916,704 | 4/1990 | Bruckert et al. | 395/182.09 |
| 4,959,774 | 9/1990 | Davis | 395/182.04 |
| 4,970,640 | 11/1990 | Beardsley et al. | 395/284 |
| 5,005,174 | 4/1991 | Bruckert et al. | 395/182.09 |
| 5,048,022 | 9/1991 | Bissett et al. | 371/40.1 |
| 5,065,312 | 11/1991 | Bruckert et al. | 395/182.09 |
| 5,068,851 | 11/1991 | Bruckert et al. | 395/183.01 |
| 5,099,485 | 3/1992 | Bruckert et al. | 395/182.09 |
| 5,146,588 | 9/1992 | Crater et al. | 395/182.04 |
| 5,148,540 | 9/1992 | Beardsley et al. | 395/182.03 |
| 5,153,881 | 10/1992 | Bruckert et al. | 395/182.08 |
| 5,157,776 | 10/1992 | Foster | 395/458 |
| 5,201,053 | 4/1993 | Benhase et al. | 395/289 |

*Primary Examiner*—Eddie P. Chan
*Assistant Examiner*—Reginald G. Bragdon
*Attorney, Agent, or Firm*—F. E. Anderson; R. M. Sullivan

[57] ABSTRACT

A method and system for controlling data flow in a storage subsystem containing multiple cache and/or multiple NVS elements based on the operability of the cache arrays and NVS arrays. In a data processing system having a storage controller connecting a plurality of host processors and a plurality of storage devices, this invention provides a method and architecture for managing multiple storage elements within the controller, without a degradation in subsystem performance and without data integrity problems. A set of configuration registers is utilized by the microcontroller to direct cache and NVS access to the proper storage array. A configuration table is loaded with status information concerning the memory arrays at Initial Microcode Load (IML) and this information is periodically updated during controller operation. The microcode can then either directly load the entries in this table into the configuration registers or the microcode can directly reference the table to determine available resources and make the appropriate decisions.

2 Claims, 4 Drawing Sheets

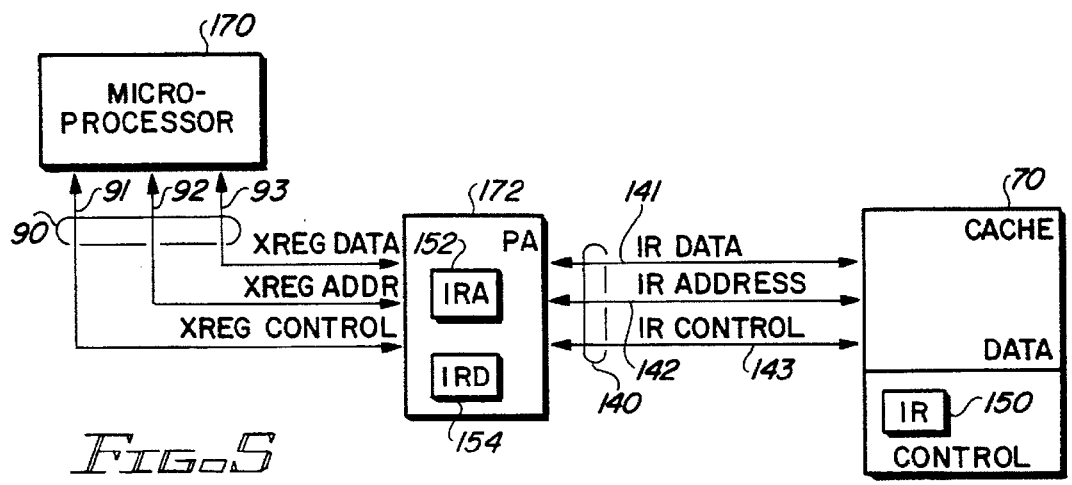

FIG. 5

| TABLE 2 ( PAGE 1 OF 2 ) CONFIGURATION REGISTERS ||||
|---|---|---|---|
| CFG1 ('ED'x)  148 || CFG2 ('EE'x)  142 ||
| BIT | DESCRIPTION | BIT | DESCRIPTION |
| 0 | WRT IR NVS A | 0 | WRT IR UPPER CACHE A |
| 1 | WRT IR NVS B | 1 | WRT IR UPPER CACHE B |
| 2 | RD IR NVS A | 2 | RD IR UPPER CACHE A |
| 3 | RD IR NVS B | 3 | RD IR UPPER CACHE B |
| 4 | WRT DATA NVS A | 4 | WRT DATA UPPER CACHE A |
| 5 | WRT DATA NVS B | 5 | WRT DATA UPPER CACHE B |
| 6 | RD DATA NVS A | 6 | RD DATA UPPER CACHE A |
| 7 | RD DATA NVS B | 7 | RD DATA UPPER CACHE B |
| CFG3 ('EF'x)  144 || CFG4 ('FF'x)  146 ||
| BIT | DESCRIPTION | BIT | DESCRIPTION |
| 0 | WRT IR LOWER CACHE A | 0 | WRT IR COM/OVERALL A |
| 1 | WRT IR LOWER CACHE B | 1 | WRT IR COM/OVERALL B |
| 2 | RD IR LOWER CACHE A | 2 | RD IR COM/OVERALL A |
| 3 | RD IR LOWER CACHE B | 3 | RD IR COM/OVERALL B |
| 4 | WRT DATA LOWER CACHE A | 4 | UNUSED |
| 5 | WRT DATA LOWER CACHE B | 5 | UNUSED |
| 6 | RD DATA LOWER CACHE A | 6 | UNUSED |
| 7 | RD DATA LOWER CACHE B | 7 | UNUSED |

FIG. 6

TABLE 3. CONFIGURATION TABLE 120

| OPERATION | READ/WRT CACHE IR/DATA | READ/WRT NVS IR/DATA | COMMON REGS. |
|---|---|---|---|
| CACHE A R/W | CFG2/3 VALUE | CFG1 VALUE | CFG4 VALUE |
| CACHE B R/W | CFG2/3 VALUE | CFG1 VALUE | CFG4 VALUE |
| DUAL WRITE | CFG2/3 WRITE | CFG1 VALUE | RESERVED |

FIG. 7

TABLE 4. BOTH CACHES AND BOTH NVSs AVAILABLE

| OPERATION | CFG2/3 | CFG1 | CFG4 |
|---|---|---|---|
| CACHE A | 'AA'x | 'AA'x | 'A0'x |
| CACHE B | '55'x | '55'x | '50'x |
| DUAL WRITE | 'EE'x | 'EE'x | RESERVED |

FIG. 8

TABLE 5. CACHE A FILES

| OPERATION | CFG2/3 | CFG1 | CFG4 |
|---|---|---|---|
| CACHE A | '33'x | '33'x | '30'x |
| CACHE B | '55'x | '55'x | '50'x |
| DUAL WRITE | '55'x | 'EE'x | RESERVED |

FIG. 9

USE OF CONFIGURATION REGISTERS TO CONTROL ACCESS TO MULTIPLE CACHES AND NONVOLATILE STORES

This is a continuation of U.S. application Ser. No. 07/992,368, filed Dec. 17, 1992, now abandoned.

BACKGROUND OF THE INVENTION

1. Field of the Invention

This invention relates to data storage subsystems employing multiple caches and/or multiple non-volatile storage elements interposed between one or more host processors and a secondary storage device. More particularly this invention provides a convenient and efficient method and architecture for managing these multiple elements based upon their operability.

2. Description of the Related Art

Over the past few years, cache, or high density electronic storage has been introduced into DASD storage subsystems. Access time between the cache and the channel is much faster than that between DASD and the channel. There are various physical device movements and other operations associated with DASD which limit data transmission speed which are eliminated by caching. One such limitation is the time required for the magnetic disk to rotate until it is aligned with the transducer contained in the read head. Another is the limited bandwidth associated with the magnetic transducers used to read and write data.

These limitations are not present with a cache access. Through the use of various caching algorithms, frequently used data is maintained in cache storage rather than being read directly from DASD and, as a result, can be supplied to the channel at the speed associated with electronic storage rather than that of magnetic storage.

For read operations data can be transferred between the cache and channel at channel speeds which can often be as high as 18 MB per second, depending upon the host processor, cache and channel configurations. In addition, as will be explained later, it is also possible to accept and process write operations originating from the channel at greatly improved speeds through the use of cache.

With the benefit of caching read operations recognized, designers, intent upon further improving system performance, turned to write operation caching to supplement the previously described read caching operations. Write caching, however, involves a data integrity problem not present when caching data for a subsequent read operation. In the event of a power loss to the cache, cache memory being volatile, data residing in the cache memory will be lost. Thus it is apparent that a backup copy of cached data is necessary if write operation caching is desired.

Recognizing this problem, designers, such as those involved with the IBM 3990 DASD Controller, added non-volatile storage (NVS) to the controller hardware. The NVS memory array is supported by a battery backup system that can maintain the data in the NVS for a finite period of time after power failure. In the event of a power failure, any data residing in nonvolatile storage is written to DASD, at the time power is restored, under the direction of the DASD controller.

Cached write operations, as well as the above mentioned read operations are now described. Cache operations take four basic forms. The first of these forms is termed subsystem caching or read only caching. This type of caching allows direct transfer of data from the cache, if the data is present in the cache, to the channel. This situation is known as a "read hit". If the data requested by the channel is not present in the cache, a "read miss" occurs and the data must be retrieved from the DASD device. When this happens, the data is concurrently written to cache in anticipation of future requests for that data. In addition, the data present from the requested record to the end of the DASD track is copied into cache.

The second cache operation is a "DASD fast write". This operation, unlike subsystem caching, is a write operation. As with any cached write operation, DASD fast write requires an NVS backup, associated with the cache memory to prevent data loss in the event of a power failure. DASD fast write allows for faster write operation processing in that access to the DASD device is not necessary if the data is present in cache. If it so happens that the data to be written is present in the cache, instead of writing the data update to DASD, the storage director copies the data received from the channel into cache and NVS. Once this is done, the storage director can return channel end and device end status.

In this manner host processing can continue without waiting for the data to be placed on DASD. The data is not actually written to DASD until it is necessary to free space in the cache or NVS. If the data is not present in the cache, then a "write miss" occurs and the data is written to DASD and to cache simultaneously and immediately. In addition, the remainder of the track containing the record to be written is staged to cache for future anticipated use.

A third cache operation is known as "cache fast write". It is quite similar to DASD fast write except that data is never written to NVS and in many situations data is never written to DASD. Cache fast write is primarily intended for data that is not required at job completion (e.g. sorting files using intermediate work files) or data that can be reconstructed easily. Cache fast write is typically enabled through program modification in contrast to DASD fast write which can be activated through a system utility command.

The fourth basic cache operation is dual copy. Dual copy allows for the creation of a second, duplicate copy of data on a different device within the storage subsystem. Dual copy is typically used with critical data as protection against a single device failure. In case of a primary device failure, data transfer operations are switched automatically to the secondary device in a manner transparent to the application program.

Dual copy treats a write in much the same manner as a standard write operation. Once data has been written to the primary volume, the storage control sends a channel-end and device-end status to the channel (allowing the host to continue processing) and then writes the data to cache and its associated control information to NVS. The data is then written to the secondary volume. Data is read only from the primary volume unless a device failure makes it necessary to use the secondary volume.

With the obvious advantages of caching in mind, it can be recognized that a system will achieve optimum performance by implementing the caching operations at all times. However, this is not possible in the event of certain system failures. In order to address this problem, controller designs have provided for multiple power partitions, each partition containing one or more subsystem components. As an example, the IBM 3990 Model 3 contains two storage clusters, each containing two paths to DASD peripherals such as a string of IBM 3390 DASDs. Each storage cluster is contained within its own power and service boundary. Moreover, the IBM 3990 Model 3 includes one cache and one NVS each shared by all four storage paths in the subsystem and each having its own power supply.

Thus a failure causing the loss of one of the clusters will permit the other cluster to continue functioning and allow for two storage paths between DASD and the host processor. However, if the single cache memory only is lost, the subsystem can continue to operate only by transferring data directly between DASD and the channel. Thus, an overall degradation of system performance will occur should this single point of failure occur.

It has been recognized that cached read and/or write operations within the DASD controller could continue even in the face of cache failure if one or more additional cache arrays are provided. In order to maintain the extended caching function, however, it is necessary that the additional caches be located in a separate power region from the first cache and preferably from all other subsystem components.

It is further desirable to include an additional NVS shadowing each additional cache memory and to include them in separate power regions as well. While additional cache arrays could be added without a corresponding shadow NVS, this would require NVS sharing among cache arrays and would allow a single point of failure for some cache functions such as DASD fast write.

The person of ordinary skill in the art will recognize that the addition of multiple memory elements requires a control mechanism to differentiate among them in the case of data transfers. This is especially so since each of the multiples caches and each of the multiple NVSs used in the storage controller will use the same address as far a the microcontroller is concerned. Furthermore, additional microcode logic to implement this function can be costly in terms of subsystem efficiency. In addition, an implementation using additional microcode logic introduces the possibility for logic defects and thus subsystem failures.

SUMMARY OF THE INVENTION

It is therefore an object of the invention to provide a method for managing a data storage subsystem in a data processing system.

It is another object of the invention to increase the operating speed of the subsystem as well as to provide data integrity within the subsystem.

It is a further object of the invention to provide a method and architecture that allows caching operations to continue even in the event of a power loss to one or more of the memories.

It is yet another object of the invention to provide a method for controlling which cache and which NVS is accessed in a particular data transfer operation.

It is a further object of the invention to provide the above mentioned control in a simple and efficient manner.

It is yet a further object of the invention to limit knowledge of the operability of various subsystem components and access control to only those subsystem components that require this knowledge.

It is still a further object of this invention to provide access control in a manner that is transparent to the host and host applications.

BRIEF DESCRIPTION OF THE DRAWINGS

The above and further objects, features and advantages of the present invention will become more apparent from the following detailed description taken in conjunction with the accompanying drawings, wherein:

FIG. 5 is a block diagram showing the indirect addressing function of the storage controller;

FIG. 6 is a table showing the bit configurations of the configuration registers;

FIG. 7 is a representation of the configuration table;

FIG. 8 is a representation of the configuration table when all elements in the storage controller are available; and FIG. 9 is a representation of the configuration table when cache A has failed.

DETAILED DESCRIPTION OF THE INVENTION

Figure 1:
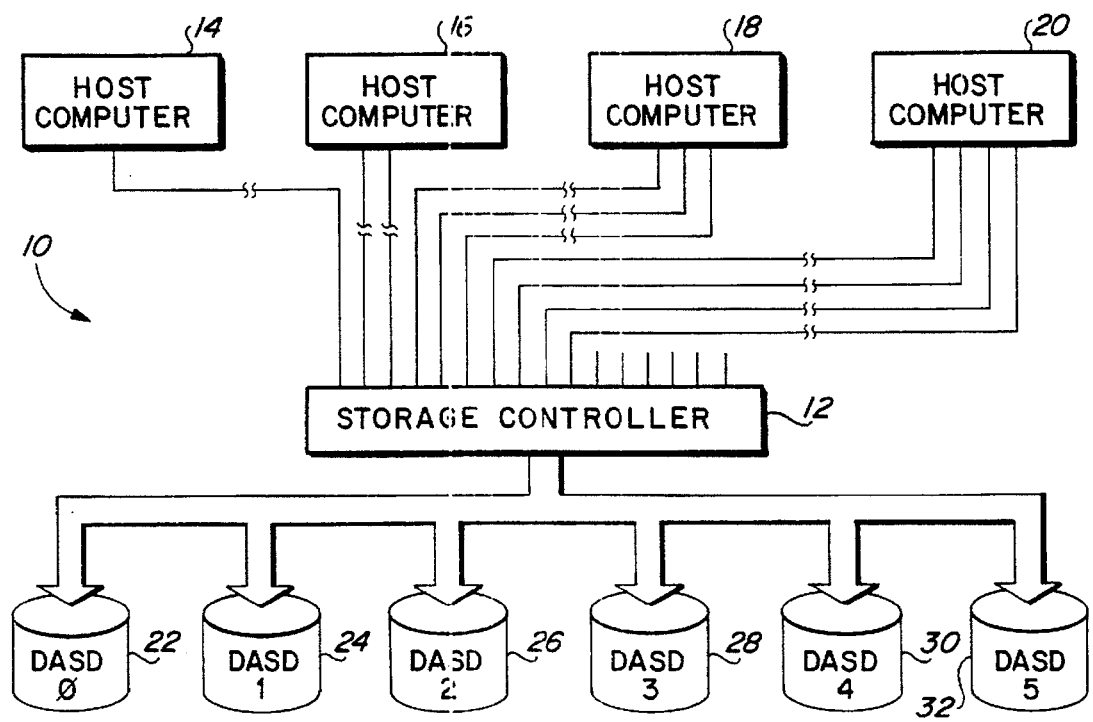
FIG. 1 is a block diagram of a data processing system typical of one used to implement the method and apparatus of the present invention.

Referring now to FIG. 1, a data processing system 10 in which the present invention is embodied will be described.

Data processing system 10 includes a storage controller 12, a plurality of host processors 14, 16, 18 and 20 and a plurality of direct access storage devices (DASD's) 22, 24, 6, 28, 30 and 32. DASDs are generally magnetic storage units such as disk drives. In this embodiment, the DASDs 22–32 are connected to the storage controller 12 for selective connection to any or all of the host processors 14–20. The storage controller 12 is preferably an IBM model based upon the IBM 3990 Model 3 but enhanced in a number of ways to be discussed below. Host processors 14–20 are typically main frame systems such as the IBM 3090, the ES9000 Model computer, or comparable systems.

The host processors 14–20 are connected to storage controller 12 through either 4, 8, 12, or 16 system adapters (SAs). There are two types of SAs: parallel and ESCON, both of which are known to those of ordinary skill in the art. Parallel SAs provide attachment to channels via a parallel I/O interface. ESCON SAs provide channel attachment via the ESCON I/O interface. Various SA configurations can be used with a minimum of four and a maximum of sixteen SA's connected to the storage controller 12. Storage controller 12 has the ability to provide up to 128 host channels when using ESCON SAs. While it is necessary to understand, generally, that channels connect to the storage controller, a discussion of the various channel configurations is beyond the scope of this specification.

Figure 2:
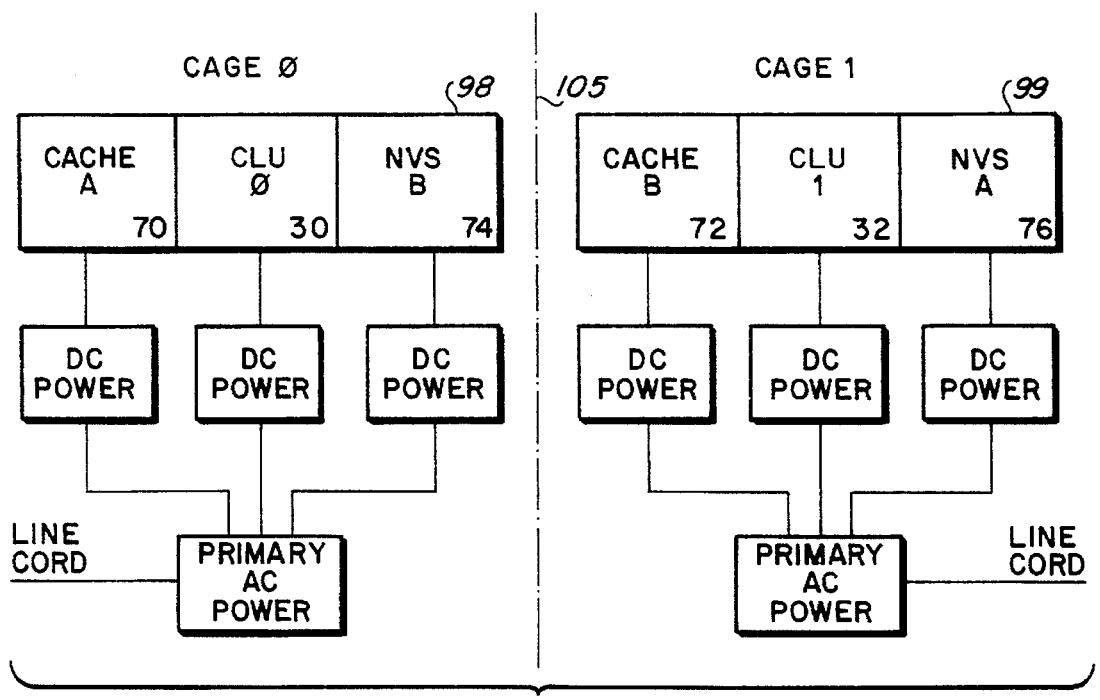
FIG. 2 is a block diagram of a storage controller in the data processing system of FIG. 1.

Turning now to FIG. 2, the storage controller 12 embodying this invention is shown in greater detail. The storage controller 12 has two cages 98 and 99 separated by a power and service boundary 105. Each cage 98 and 99 contains one storage cluster 30 or 32, one NVS 74 or 76 and one cache 70 or 72. Each cage is designed so that no single cluster, NVS or cache failure or maintenance action will render the other cage inoperative.

Cluster number 0 30 and cluster number 1 32 are independent components. Each cluster is located in a separate power and service region and provides two paths to DASD. A loss of power to one cage does not prevent host processor access to data because processing can continue through the two storage paths of the other cluster. This is possible because all DASDs are connected to both storage clusters. Moreover, a single cage can be taken down for maintenance while still 11owing DASD and cache access through the two storage paths of the remaining cluster.

The components of the storage controller 12 will be described in more detail with reference to FIG. 3. The system of the current invention includes two cache storage arrays 70 and 72. Each is located within a separate power and maintenance boundary. Further, the system includes two NVS storage arrays 74 and 76. Typically the system is set up, in the absence of any component failure, with NVS A 76 shadowing Cache A 70 and NVS B 74 shadowing Cache B 72. Cache A 70 and NVS B 74 are associated with cage number 0 98 and Cache B 72 and NVS A 76 are associated with cage number 1 99. As will be seen, the use of two caches backed by two NVSs, each located in an independent power region, allows for continued caching function in the event of a single failure or a power loss. Both read and write caching are guaranteed in the face of a single point of failure.

In the case of a cage power failure, only one cache and one NVS will be available (Cache A 70 and NVS B 74 or Cache B 72 and NVS A 76). Assuming cage 0 98 powers down only Cache B 72 and NVS A 76 will be available and there will be an emergency destage from NVS A 76 (shadowing now failed Cache A 70) to DASD. Furthermore, modified tracks in Cache B 72 are also destage if possible. At this point, system status will be set so that it is globally known that Cache A 70 and NVS B 74 are unavailable. Processing will continue through storage paths 2 (64) and 3 (66) using Cache B 72 for all caching operations. Cache B 72 is now shadowed by NVS A 76.

In the event that a single cache, for example Cache A 70, fails, caching operations are still possible through Cache B 72. In this case, global subsystem status is set to reflect the unavailability of Cache A 70. Next, records are emergency destaged from NVS A 76 (which shadows the now failed Cache A 70) to DASD. The system will now be configured so that all caching takes place through Cache B 72 with NVS B 74 shadowing Cache B 72 and NVS A 76 suspended.

If a single NVS fails, for example NVS A 76, global subsystem status is first set so that all storage paths are aware of the failure. DASD fast write modified data entries located in Cache A 70 are then destaged if possible. Those that are not destaged are transferred from Cache A 70 to Cache B 72 if possible. Cache A 70 is then suspended and caching takes place through Cache B 72 which is shadowed by NVS B 74.

Figure 3:
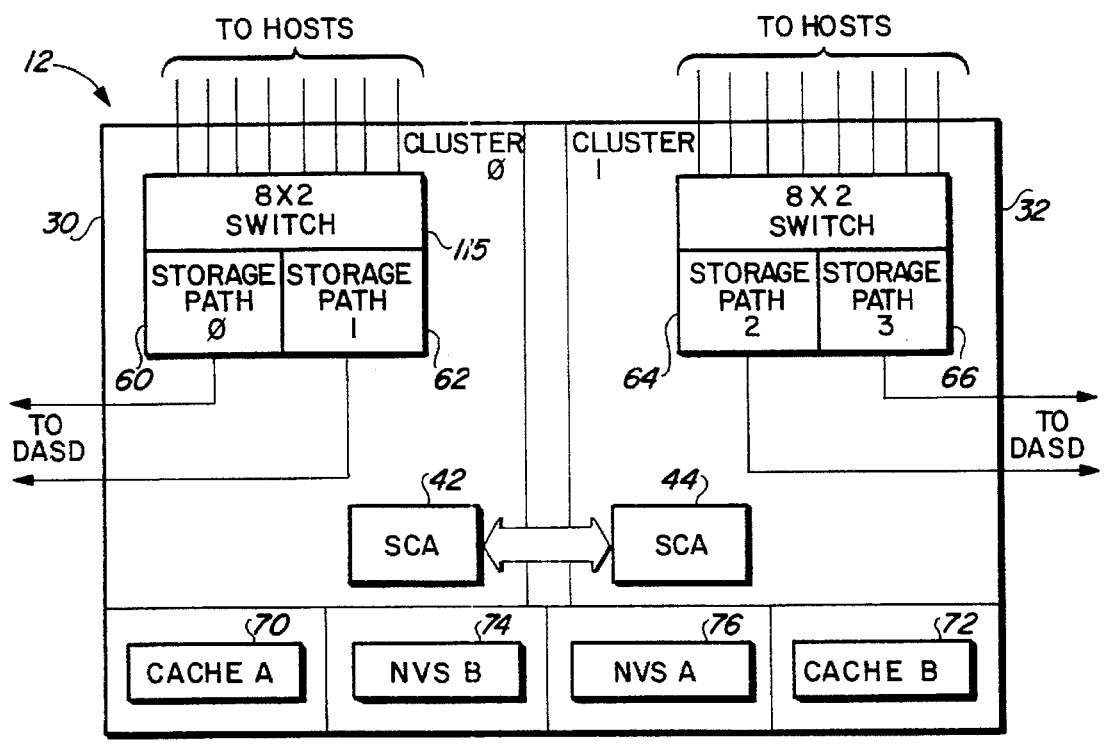
FIG. 3 is a block diagram of the two cages contained in the storage controller of FIG. 2.

Returning to the description of the components in the storage controller 12 depicted in FIG. 3, it can be seen that each cluster is configured with two Storage Paths (SPs) 60, 62, 64 and 66. Each storage path contains a microcontroller capable of interpreting channel commands from the host and controlling the attached DASDs.

Further, each cage contains Shared Control Array (SCA) storage 42 and 44. The SCA stores local status information as well as status information shared with the SCA located in the other cage within the storage controller 12. In this way, unless there is a failure condition present in one or both of the cages, the contents of the two SCAs is identical. To maintain correspondence between the two SCAs, it is necessary that any time an SP writes to an external register of its local SCA, the hardware updates a corresponding copy register through a remote port to the remote SCA. Typical shared data includes device status and reconnection data as well as a variety of external registers used by the microcontrollers contained in each of the storage paths 60, 62, 64, and 66. SCA data is accessible to all four storage paths 60, 62, 64, and 66. It is important to note that this access is over fault independent paths so that in the case of a power failure in, for example, cage 1, storage path 0 (located in cluster 0) would continue to have access to the SCA of cage 0.

Figure 4:
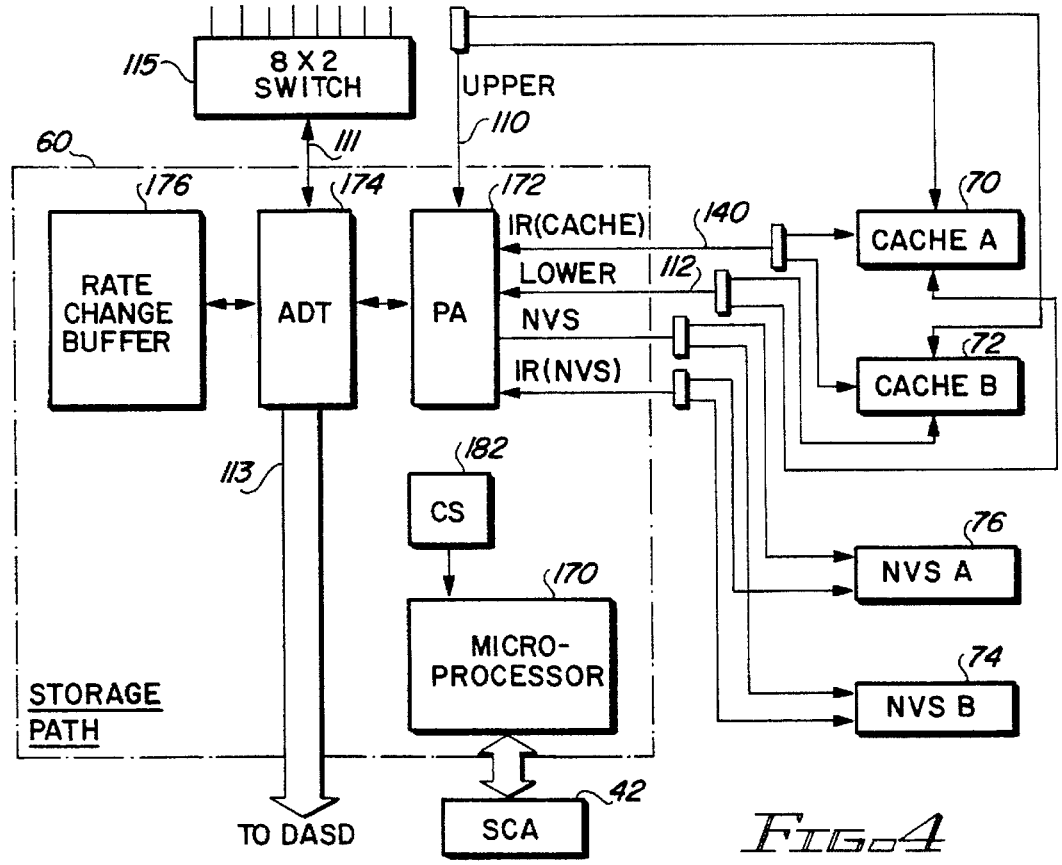
FIG. 4 is a block diagram of a storage path processor.

FIG. 4 shows one of the four storage paths 60 in the storage controller 12 in a block diagram schematic. All four storage paths being identical, and only one will be described herein. Storage path 60 is connected to 8×2 switch 115 by an upper port 110 and to a plurality of DASDs by a lower port 112. Data transfer between the 8×2 switch 115 and one of the DASDs during direct DASD operations occurs via an automatic data transfer circuit (ADT) 174 supported by a rate change buffer 176, if required. Rate change buffer 176 compensates for differences between the speed of data transference by DASD and that of channel to host communications. As mentioned above, channel transfers typically occur at a much higher rate than DASD to controller transfers.

The storage path 60 also contains a microcontroller 170 which functions to control all operations taking place on the storage path 60. The microcontroller 170 executes microinstructions which are loaded into a control store (CS) 182 through an external support facility. The microcontroller 170 used in the preferred embodiment, addition to having internal registers, is capable of addressing up to 256 external registers located on the storage path card. There is also provision for addressing locations external to the storage path 60 such as both cache elements and both NVSs using an indirect register interface. Moreover, there exist common and overall registers on both caches and NVSs which are also addressable by the microcontroller 170. Two external registers support indirect register addressing and are labeled Indirect Register Address (IRA) and Indirect Register Data (IRD).

A port adapter (PA) 172 provides control and data paths for the transfer of data between cache 70 and 72, nonvolatile storage 74 and 76, microcontroller 170 and upper and lower ports 110 and 112. It also allows for the microcontroller 170 to perform indirect addressing to cache and NVS, using the IRA and IRD registers. The PA 172 also holds the four configuration registers that form the basis for the invention herein.

Caches 70 and 72 each contain two ports (upper and lower) to allow for two simultaneous data transfers to and/or from each cache element. By way of example, data may be transferred from cache and channel while also transferring data to cache from DASD. Data transfer is typically set up by microcontroller 170 and then taken over by the automatic data transfer 174 function without microcontroller intervention until transfer termination.

As explained above, the addition of a second cache element provides immunity against a single point of failure retaining the ability to cache in the event of a single cluster failure. However, along with this advantage comes additional complexity regarding the location of data for purposes of reads, writes and other data transfers. In the dual cache system of this invention, the controller must be concerned with matters not important in a single cache subsystem. This is so because both caches and both NVSs respond to the same read and write addresses and therefore a given address must further be mapped to a specific element.

It will now be described how the four configuration registers of this invention, which are located on the port adapter, function to allow microcode control over data stored within the subsystem depending upon available resources in the subsystem. In order for the microcode to determine which cache and/or which NVS is appropriate for the controller operation, a set of four configuration registers 140, 142, 144, 146, shown in FIG. 6, are used.

Channel/Host operations, staging, destaging and branching operations must determine which cache and NVS to use when setting up for read or write data transfers. This decision is based upon three criteria: 1) the current operational state of the caches and NVSs; 2) the amount of available space in the operational caches; and 3) the location of existing data. For example, if Cache A 70 is chosen to receive data from the channel, and NVS A 76 is operational, NVS A 76 will be used for fast write data. Likewise for Cache B 72 and NVS B 74. In the case of a cage AC power failure, only one cache and one NVS will be available (Cache A 70 and NVS B 7 or Cache B 72 and NVS A 76). The cache and the NVS in the same cage are not normally paired together. The decision time to determine which caches and which NVSs are operational and/or paired together could add considerable time to each cache operation. This would, in turn, cause a serious degradation in controller response time.

In order to avoid having each component decide which cache and which NVS to use, the microcode uses a configuration table 120 as shown in FIG. 7. This table indicates how the configuration registers 142–148 should be loaded. During cache/NVS initialization or failure recovery, the microcode sets up the configuration table 120 indicating the operational components in the controller 12. The table is located in the SCA 42 so that each SP can access it. When the operational state of any cache or NVS changes due to an error or due to a host make available/unavailable command, the microcode will update this table. The microcode can then either directly load the entries from the table into the configuration registers in the event of a data transfer, or it can use the configuration table 120 to determine the cache and NVS resources that are available. In this way, microcode components that access cache during normal operations will simply load the table values into the configuration registers without having to spend processing time determining which components are operational.

As mentioned above, indirect register addressing is used to address, read and write registers located in subsystem caches and NVSs. When the microcontroller 170 must read or write data in an indirect register in cache or when the microcontroller 170 must read or write data to a cache array storage location, it does so using the indirect register interface provided in the system of this invention.

As an illustration, a microcontroller read from an indirect register 150 located in cache 58 will now be described with reference to FIG. 5. At the time that it is determined that the indirect register 150 must be read, the microcontroller 170 first sends out data on the XREG bus 90. This bus contains 36 data lines (32 data, 4 parity), 9 address lines (8 data, 1 parity to address a possible 256 external registers) and 5 control lines. The address lines 92 will contain the address of the IRA register 152, the data lines 93 will contain the read address of the indirect register 150 and the control lines 91 will specify a write select. With the indirect register 150 address in IRA 152, the port adapter 172 can now access the indirect register 150 in cache 70. The address is sent over the IR address line 142 of the IR bus 140 with the control lines 143 set to read data from the cache indirect register 150. The data in the selected indirect register 150 is then sent back to the port adapter 172 over the IR data line 141 of the IR bus 140. The data is placed in the IRD register 154 of the port adapter 172. The microcontroller 170 can now read the IRD register 154 to acquire the data that it needs from the indirect register 150.

A microcontroller write to an indirect register can be achieved in substantially the same way with the write address of the indirect register first stored in IRA 152 and then loading the data to be stored in IRD 154 with the control lines specifying a write operation. The operations for reading or writing an NVS register are exactly the same as described above for cache, While the above described method is satisfactory in the case of a controller having only a single cache and a single NVS, such is not the case when multiple storage elements are present in the controller. Without additional control, the port adapter 172 can not know which cache or which NVS is desired in the read/write operation. The configuration registers of the present invention provide this additional control.

Configuration registers CFG1, CFG2 and CFG3 are used to handle normal cache and NVS data transfers. These three registers also provide access to cache and NVS indirect registers. CFG4 is used to access common registers within the storage path and is used in conjunction with CFG1, CFG2 or CFG3. All four of these configuration registers are located on the port adapter 172. It will now be explained, in conjunction with FIG. 6, how the registers are loaded and used by storage controller microcode.

It should first be noted that on write operations it is valid for the storage path to write to both caches 70 and 72 and both NVSs 74 and 76 at the same time. However, read operations may take place from only one cache or one NVS at a time. In order to do any type of data transfer, at least one of the caches or NVSs must be selected by the configuration registers.

CFG1 enables or disable data transfer to and from either or both of the NVSs. Bit 0 and bit 1 allow an IR write operation to NVS A 76 and NVS B 74 respectively. Bit 2 and bit 3 allow an IR read operation from NVS A 76 and NVS B 74 respectively. Bit 4 and bit 5 allow a write data transfer operation to NVS A 76 and NVS B 74 respectively. Bit 6 and bit 7 allow a read data transfer operation to NVS A 76 and NVS B 74 respectively.

Thus, if the controller 12 is functioning with both NVSs and both caches operational, and an operation is set up to cache A 70 (being shadowed by NVS A 76), CFG1 will be loaded with 'AA'x to indicate that write and read operations are permitted to both indirect registers and data areas located in NVS A 76. If, on the other hand, NVS A 76 failed or was disabled then CFG1 would be loaded with the invalid value '33'x, causing a hardware check, since it is invalid to read from both caches or both NVSs at once. Although no tracks should be allocated to NVS A 76 after it has failed, the configuration register mechanism provides additional protection against data integrity problems in the event of a microcode logic error.

CFG2 controls access to the upper ports of both caches. Bit 0 and bit 1 allow an IR write operation to the upper port of cache A 70 and cache B 72 respectively. Bit 2 and bit 3 allow an IR read operation from the upper port of cache A 70 and cache B 72 respectively. Bit 4 and bit 5 allow a write data transfer operation to the upper port of cache A 70 and cache B 72 respectively. Bit 6 and bit 7 allow a read data transfer operation to the upper port of cache A 70 and cache B 72 respectively. The interpretation of values in CFG2 is treated in the same way as described above for CFG1.

CFG3 functions in exactly the same manner as CFG2 but controls access to the lower ports of the two caches present in the system embodying this invention.

CFG4 is used to access common registers located on both caches and both NVSs. Bit 0 allows an IR write operation to cache A 70 or NVS A 76. This bit is used in conjunction with CFG1, CFG2 and CFG3 to allow or disallow common registers located on the caches and the NVSs. Thus, if bit 0 is set (to indicate access allowed) and bit 2 of CFG1 is set (also to indicate access allowed) then the indirect common registers located on NVS A 76 will be accessible to microcontroller 170 for a read operation. Bit 1 of CFG4 has the same function as bit 0, only it controls access to common registers on cache B 72 and NVS B 74.

The data which is loaded into the configuration registers by the microcontroller 170 is preferably stored in a configuration table as indicated in FIG. 7. When the state of any cache or NVS changes due to error or a make available/ unavailable command from the host, the microcode will update the table to configure each cache and NVS. The microcode can then directly load the entries in this table into the configuration registers when doing data transfer or it can simply use the table to make decisions. In this way, microcode components that access cache during normal operations will simply load the table values into the configuration registers and need not spend time determining which components are operational.

FIG. 8 shows the configuration table when both caches and both NVSs are available. As described above, when an operation on cache A 70 is necessary and all elements are operational, the value 'AA'x will be loaded from the configuration table into the configuration registers to indicate that read and write operations to indirect registers as well as data transfers is permissible.

FIG. 9 shows the configuration table after a cache A 70 failure has been detected and handled. It can be seen that the invalid value '33'x is present for a cache A operation, thus preventing it, while a valid value of '55'x is present for cache B operations, permitting both read and write to indirect registers as well as data transfers. However, if a cage power failure occurs, making both cache A and NVS B unavailable, FIG. 9 would change such that the CFG1 register for cache B would be loaded with an 'AA'x value from the configuration table to indicate that NVS A would now shadow cache B.

While the invention has been particularly shown and described with reference to the preferred embodiments thereof, it will be understood by those skilled in the art that various changes in form and details may be made therein without departing from the spirit and scope of the invention.

What is claimed is:

1. A data processing system comprising:
   at least one host processor;
   a storage subsystem including a plurality of direct access storage devices and a storage controller, said storage controller being connected to each of said direct access storage devices through a storage path and to each of the host processors by at least a first channel;
   said storage controller further including a first and second power supply, a first cache memory array, a second cache memory array, a first nonvolatile storage array and a second nonvolatile storage array, wherein said first cache memory array and said first nonvolatile storage array are coupled to said first power supply and said second cache memory array and said second nonvolatile storage array are coupled to said second power supply, and further wherein the second nonvolatile storage array provides backup to said first cache memory array and said first nonvolatile storage array provides backup to said second cache memory array; and
   means responsive to data indicating the proper functioning of said first and second cache memory arrays and said first and second nonvolatile storage arrays for reconfiguring said second nonvolatile storage array to backup said second cache memory array in the event a failure occurs in said first cache memory array and in said first nonvolatile storage array, said means for reconfiguring thereby controlling access to each of said first and second cache memory arrays and each of said first and second nonvolatile storage arrays.

2. The data processing system as set forth in claim 1 wherein said indicating data is further maintained in a configuration table accessible by the access controlling means, said access controlling means coupled to said storage paths, and wherein said configuration table is further accessible to each of said storage paths.

* * * * *